United States Patent [19]

Tsai

[11] Patent Number: 4,992,773
[45] Date of Patent: Feb. 12, 1991

[54] RESISTOR WITH SIDE WALL CONTACT

[75] Inventor: Nan-Hsiung Tsai, Cupertino, Calif.

[73] Assignee: MOS Electronics Corporation, Sunnyvale, Calif.

[21] Appl. No.: 255,074

[22] Filed: Oct. 7, 1988

[51] Int. Cl.[5] .............................................. H01C 7/00
[52] U.S. Cl. ....................................... 338/314; 357/51
[58] Field of Search .................... 338/308, 309, 314; 357/51, 68, 23.7; 156/653, 657, 659.1, 662; 427/918, DIG. 136

[56] References Cited

U.S. PATENT DOCUMENTS 4,001,762  1/1977  Aoki et al. ........................... 338/309

Primary Examiner—C. L. Albritton
Attorney, Agent, or Firm—Skjerven, Morrill, MacPherson, Franklin & Friel

[57] ABSTRACT

A resistor located above the semiconductive substrate of an integrated circuit chip can be made smaller than prior art resistors because no area is allocated for resistor contacts. During manufacture, a resistive strip having the width of the intended resistor is formed. A photoresist mask protects the top and sides of the resistive strip where the resistor is located, and etching exposes the ends but not the top and sides of the resistor. Contact to the resistor occurs at the upwardly extending (usually near vertical) end surfaces of the resistor.

5 Claims, 7 Drawing Sheets

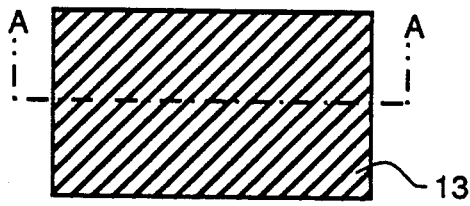
FIG. 1.1a
(PRIOR ART)
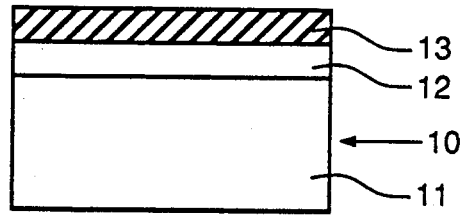
FIG. 1.1b
(PRIOR ART)
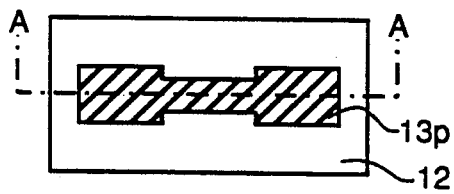
FIG. 1.2a
(PRIOR ART)
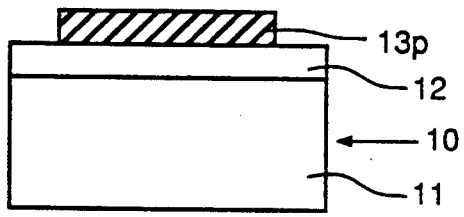
FIG. 1.2b
(PRIOR ART)
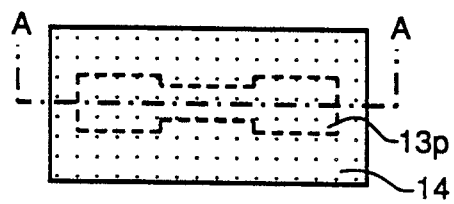
FIG. 1.3a
(PRIOR ART)
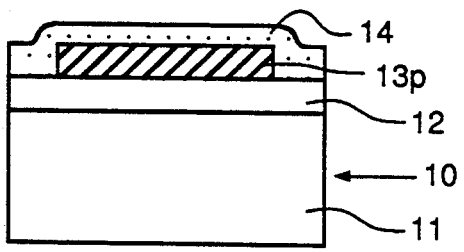
FIG. 1.3b
(PRIOR ART)

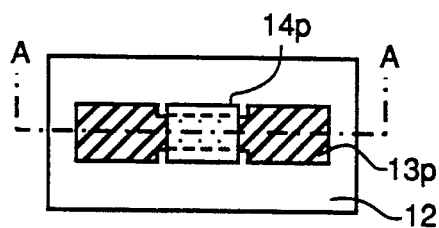
FIG. 1.4a
(PRIOR ART)
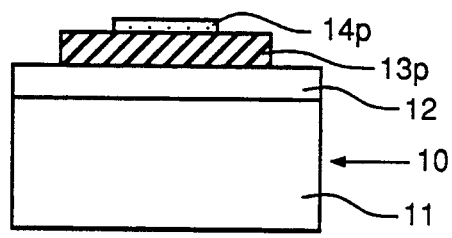
FIG. 1.4b
(PRIOR ART)
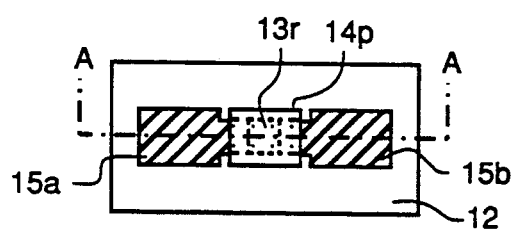
FIG. 1.5a
(PRIOR ART)
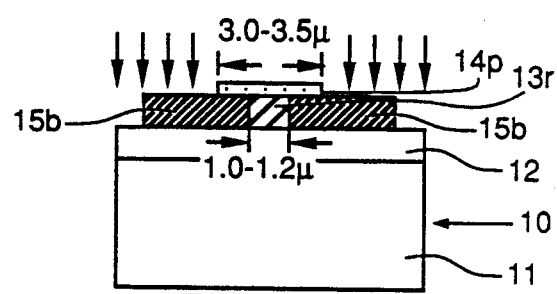
FIG. 1.5b
(PRIOR ART)
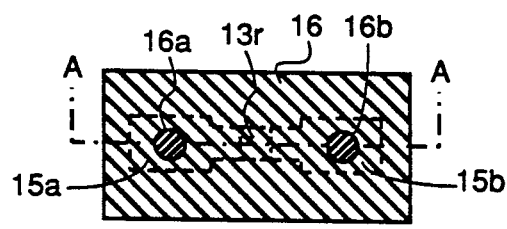
FIG. 1.6a
(PRIOR ART)
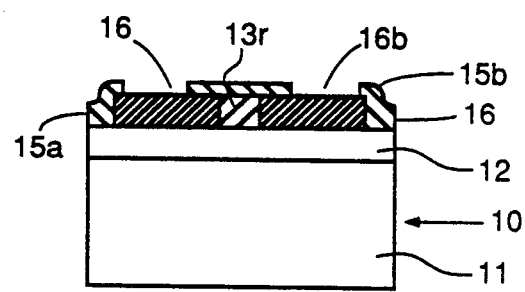
FIG. 1.6b
(PRIOR ART)
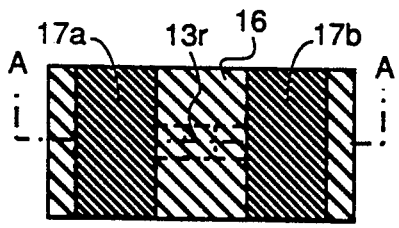
FIG. 1.7a
(PRIOR ART)
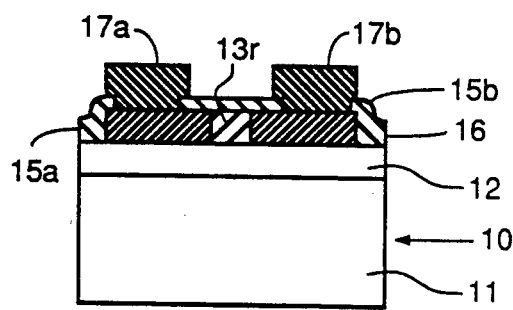
FIG. 1.7b
(PRIOR ART)

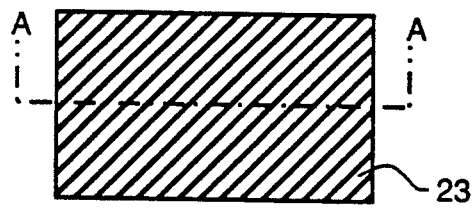
FIG. 2.1a
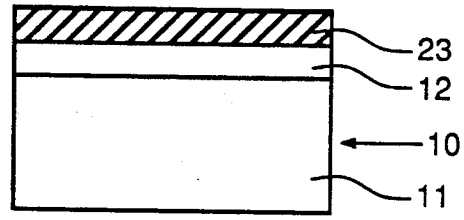
FIG. 2.1b
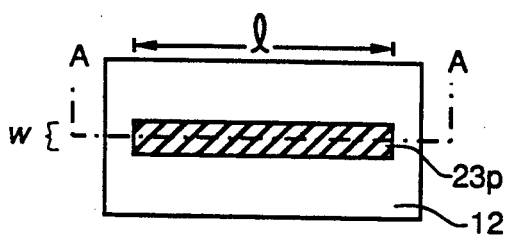
FIG. 2.2a
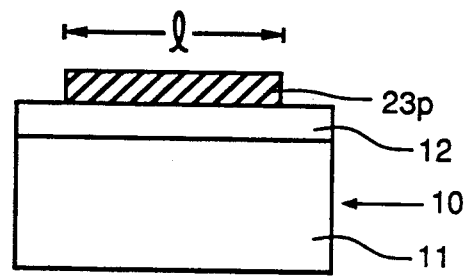
FIG. 1.2b
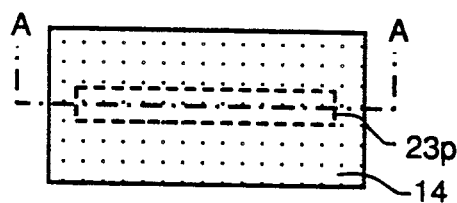
FIG. 2.3a
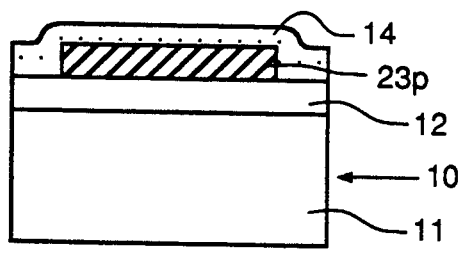
FIG. 2.3b

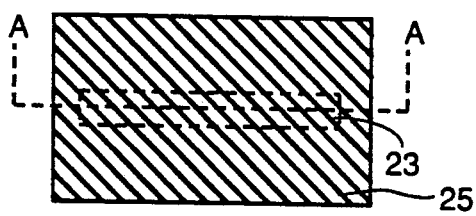
FIG. 2.4a
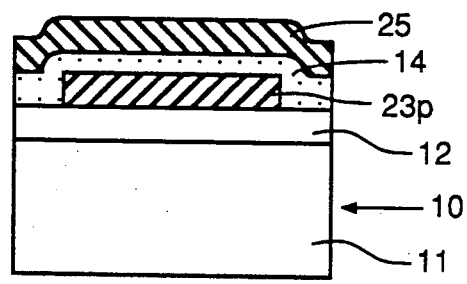
FIG. 2.4b
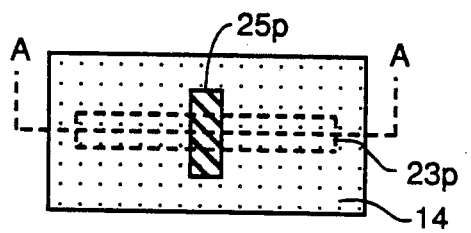
FIG. 2.5a
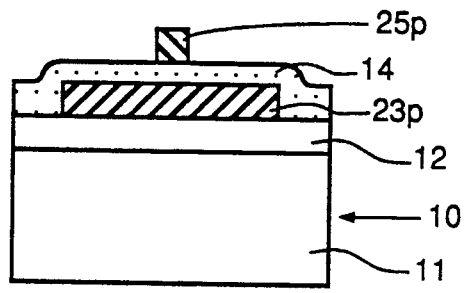
FIG. 2.5b
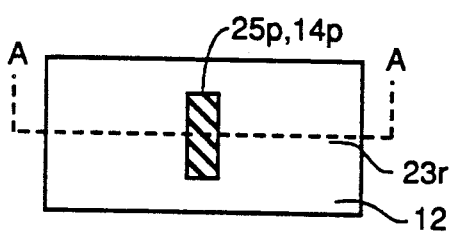
FIG. 2.6a
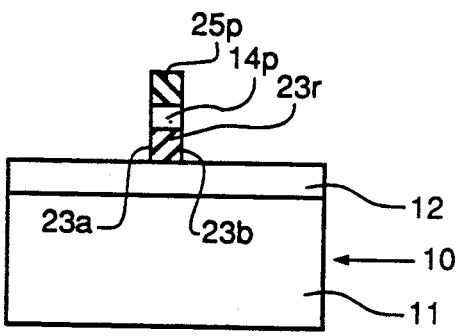
FIG. 2.6b

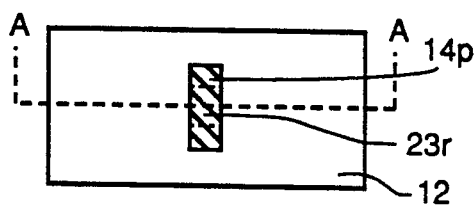
FIG. 2.7a
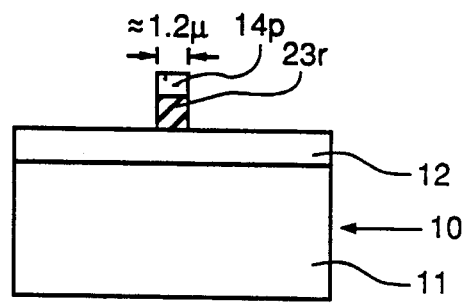
FIG. 2.7b
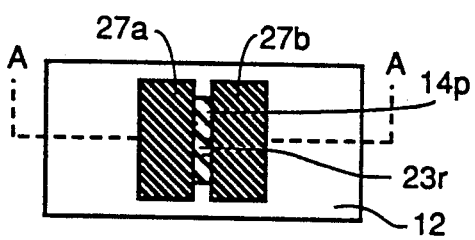
FIG. 2.8a
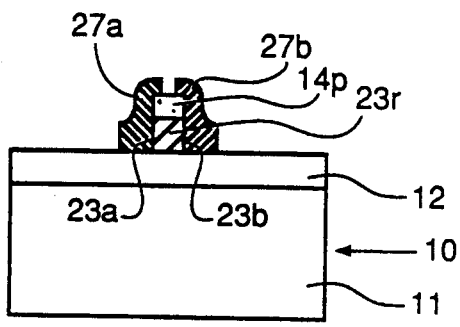
FIG. 2.8b

RESISTOR WITH SIDE WALL CONTACT

FIELD OF THE INVENTION

This invention relates to integrated circuit structures, in particular to forming a resistor above a semiconductor substrate.

BACKGROUND OF THE INVENTION

There is a persistent goal in the semiconductor industry to reduce the size of structural elements within an integrated circuit chip. In static memory cells, for example, resistors rather than transistors are frequently used as load elements in order to avoid requiring that more circuit elements be placed in the semiconductive substrate. The resistor may be located above other active elements in the substrate and therefore the static memory cell can occupy less total space. However, resistors themselves may occupy more area than desired because a typical resistor requires a contact area to connect other elements to the resistor, and this contact area also occupies space that could be used for other elements. It is beneficial to reduce the space occupied by the contact area.

Also, since successive layers in an integrated circuit structure are patterned using separate masks, space must be allocated for misalignment of one mask with respect to the next. A process which reduces the space needed for misalignment or for forming the contacts reduces the total space which must be used for a circuit element. This in turn increases the speed with which an integrated circuit can operate and the number of elements which can be located in an integrated circuit of a given size.

FIGS. 1.1a through 1.7b show top and side views respectively of steps and the resulting structure of a prior art resistor 13r. FIGS. 1.1b through 1.7b are cross-sectional side views of FIGS. 1.1a through 1.7a respectively, taken along the line A—A. The same reference numerals indicate the same elements in successive figures. As shown in FIG. 1.1b, onto a substrate 11 is formed structure 12, which may comprise an oxide layer, an oxide layer covered by a nitride layer, or may comprise a more complex structure including more than one layer of oxide, polycrystalline silicon and other materials. The top portion of layer 12, however, is an insulator. To form a resistor, onto layer 12 is applied a highly resistive material, for example, undoped or lightly doped polycrystalline silicon layer 13, as shown in FIGS. 1.1a and 1.1b, typically 1000–5000Å thick.

As shown in FIGS. 1.2a and 1.2b, layer 13 is patterned to form a structure 13p which will comprise both a resistor and its conductive contact regions. As shown in FIGS. 1.3a and 1.3b, a protective layer 14 which may be of insulating material, including oxide or oxide and nitride, or, alternatively photoresist, is formed on the surface of the structure, contacting resistive structure 13p and exposed portions of layer 12. Layer 14 is patterned, as shown in FIGS. 1.4a and 1.4b, to form mask 14p, exposing resistive structure 13p except at a location beneath part of mask 14p which will remain highly resistive. As shown in FIG. 1.5b, an impurity doping is performed, for example by diffusion or ion implantation, producing doped regions 15a and 15b, and leaving a resistor 13r beneath mask 14p. Because the doped impurity diffuses upon subsequent heating, the highly doped regions 15a and 15b extend beneath mask 14p. In order to retain a sufficiently high resistance of resistor 13r (FIG. 1.5b) the final length of resistor 13r between the two conductive regions 15a and 15b is normally about 1.0 to 1.2 microns. Because the lateral diffusion extends approximately 1.0 to 1.25 microns beneath each edge of mask 14p, the length of protective region 14p must typically be 3.0 to 3.5 microns.

Space allocation for protective region 14p is less if the materials used do not require an implant with resulting lateral diffusion. In such a case, protective region 14p may be as short as 1.0 to 1.2 microns.

As shown in FIGS. 1.6a and 1.6b, an oxide layer 16 has been applied and patterned to open vias 16a and 16b, exposing contact points in regions 15a and 15b. Finally, as shown in FIGS. 1.7a and 1.7b, conductive layer 17, often aluminum, but also feasibly polycrystalline silicon or a refractory silicide such as $PtSi$, $WSi_2$, $TiSi$, $TaSi_2$, or $MoSi_2$, is applied to the surface of the structure and patterned to leave conductive lines 17a and 17b.

In addition to the 1.0 to 1.2 micron spacing for the resistor mask, an additional allowance of some 0.5 micron at each end must be allowed for misalignment of contact openings 16a and 16b with respect to resistor 13r.

Allowing a minimum size of 1.2 microns for each of the contact openings 16a and 16b, 1.0 to 1.2 microns for the resistor 13r (necessary to assure a desired resistance of several hundred gigaohms to several teraohms), and 0.5 micron at each end for misalignment, the total length of the prior art structure of FIGS. 1.1a through 1.7b remains about, 4.4–4.6 microns.

SUMMARY OF THE INVENTION

The present invention achieves a further and significant decrease in size of the overall structure of an integrated circuit resistor. According to the present invention, very little surface area must be allocated for forming contacts to the resistor because resistor contact is made at two side surfaces of the resistor. Furthermore the step of exposing the contact points of the resistor occurs simultaneously with shaping the resistor itself, thereby simplifying the process. Also no space must be allocated for lateral diffusion of an implanted region beneath a protective mask because according to the present invention, there is no impurity doping.

According to the present invention, a resistive layer, preferably undoped polycrystalline silicon, is formed on an insulating layer, and patterned into a region having the width of the to-be-formed resistor. An insulation layer, preferably silicon dioxide, is applied to the structure, covering the resistive region. A layer of photoresist is formed and patterned above this insulating layer. The photoresist is then patterned to leave a protected region, which can be as short as the resolution capability of the user's exposure equipment. State-of-the-art resolution is currently 1.2 microns. The insulating and resistive material not protected by photoresist is then removed. The protective photoresist is then removed, leaving a resistor covered on its top and sides by the insulating material and exposed on two ends. These exposed ends will serve as contacts A conductive layer applied to the exposed structure makes contact with the exposed ends of the resistive material. Patterning separates parts of the conductive layer contacting one end of the resistive material from parts of the conductive layer contacting the other end of the resistive material, thus forming a resistor considerably smaller than the prior art resistors discussed above. In comparison to the prior art example having a resistor length of 1.2 microns and a misalignment tolerance of 0.5 microns on each side and which required a linear space allocation of 4.4 to 4.6 microns, the linear space allocated for forming one resistor according to the present invention can be 2.0 microns.

BRIEF DESCRIPTION OF THE DRAWINGS

FIGS. 1.1a through 1.7a show top views of successive steps in forming a prior art resistor.

FIGS. 1.1b through 1.7b show cross sectional side views of successive steps in forming the prior art resistor of FIGS. 1.1a through 1.7a.

FIGS. 2.1a through 2.8a show top views of successive steps in forming a resistor of the present invention.

FIGS. 2.1b through 2.8b show cross sectional side views of successive steps in forming a resistor of the present invention.

DETAILED DESCRIPTION OF THE INVENTION

Figure 3:
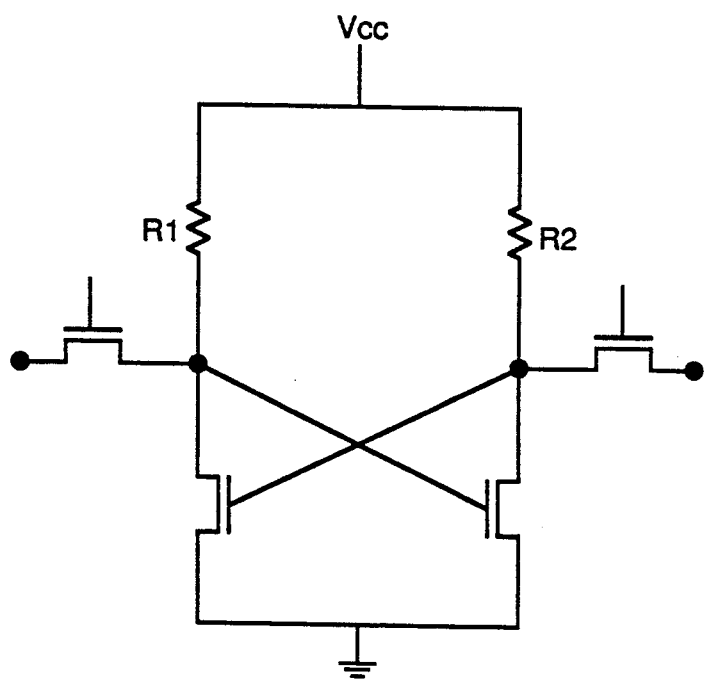
FIG. 3, shows, a typical memory cell circuit having resistors which can be formed using either the prior art method and structure or that of the present invention.

Formation of the structure of the present invention begins as in the prior art structure, with a layer 12 of structural elements as discussed above in connection with FIGS. 1.1a and 1.1b. As shown in FIGS. 2.1a and 2.1b, a layer of highly resistive material, preferably undoped polycrystalline silicon 23 having a thickness of several hundred to several thousand angstroms and a resistivity on the order of several hundred megaohms to several teraohms per square is formed on layer 12.

As shown in FIGS. 2.2a and 2.2b, layer 23 is patterned into resistive structure 23p, to establish the width w of the intended resistor and a length 1 greater than the intended resistor. An insulating layer 14, preferably silicon dioxide 1000-5000 angstroms thick, is formed on the exposed surface of the structure, contacting resistive structure 23p and exposed portions of layer 12.

As shown in FIGS. 2.4a and 2.4b, photoresist layer 25 is applied to unpatterned insulating layer 14. As shown in FIGS. 2.5a and 2.5b, photoresist layer 25 is then patterned to leave a protected region 25p above resistive region 23p protecting a final resistor length preferably of some 1.2 microns. Photoresist protective region 25p is patterned to have a width dimension greater than the width of resistive region 23p. Moderate misalignment of the pattern of photoresist protective region 25p will not have an adverse effect on the size of the final resistor structure, which will be determined by the intersection of the two patterns 3p and 25p.

As shown in FIGS. 2.6a and 2.6b, photoresist protective region 25p serves as a mask for etching insulating layer 14 and resistive region 23p to form a structure comprising resistor 23r and insulating structure 14p. Although the surfaces 23a and 23b exposed by etching are shown to be vertical, it is preferred that the surfaces have a less than vertical slope in order to improve the joint between surfaces 23a and 23b and the contact to be formed. Providing a less steep slope increases the linear distance occupied by the resistor, therefore it is preferred that the slope be fairly steep.

As shown in FIGS. 2.7a and 2.7b, photoresist protective region 25p is then removed.

As shown in FIGS. 2.8a and 2.8b, a metallization layer is applied and patterned to form metallization regions 27a and 27b. Metallization region 27a contacts resistor 23r at end 23a and metallization region 27b contacts resistor 23r at end 23b. The areas of contact regions 23a and 23b are on the order of 0.1 to 0.5 square microns, much smaller than the approximately 1.1 square micron area of the prior art contact regions discussed in connection with FIGS. 1.1a to 1.7b. Thus the contact itself may add resistance to the resistor However, since the function of the element is to be a resistor, an added resistance at the contact area is acceptable.

Size comparisons between the prior art and the current invention have been made using the same design rules, in particular the same optical resolution limits and the same alignment tolerances. For other design rules, other sizes will of course occur. The sizes used in this description are illustrative only and not intended to be limiting.

Figure 4:
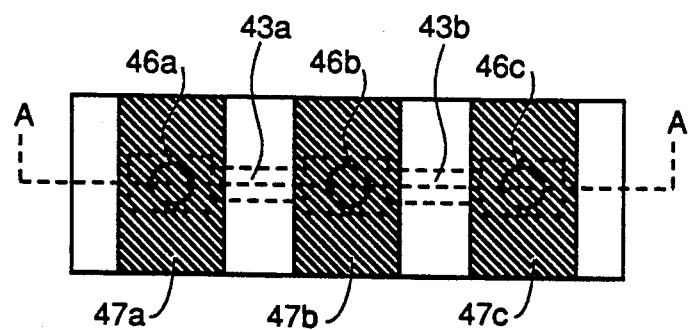
FIG. 4 shows a prior art resistor divider network.
Figure 5:
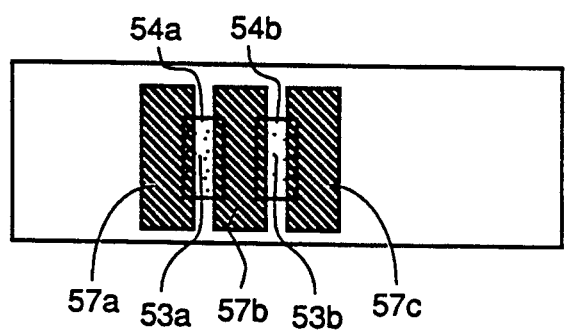
FIG. 5 shows a resistor divider network formed according to the present invention.

The above described resistor structure and method for making can also be advantageously used for forming more than one adjacent resistor, notably a resistor divider in which two adjacent resistors are formed with a contact between them. FIGS. 4 and 5 show top views of, respectively, a prior art resistor divider and a resistor divider of the current invention, drawn to the same scale as FIGS. 1.7a and 2.8a. Spacing between contact openings 46a and 46b or 46b and 46c of FIG. 4 is the same as spacing between contact openings 16a and 16b of FIG. 1.6a. Therefore spacing between contact lines 47a and 47b or between contact lines 47b and 47c is the same as in FIG. 1.7a. By contrast, in the current invention, as shown in FIG. 5, no contact openings exist, contact being made to vertical or near vertical surfaces. Spacing between contact lines 57a and 57b or between lines 57b and 57c is the same as spacing between lines 27a and 27b of FIG. 2.8a.

Using the same design rules discussed earlier, total length of the prior art resistor divider of FIG. 4 is 8.6 microns while total length of the resistor divider of FIG. 5 is 5.1 microns. Thus the advantage of the present invention is again evident. Many variations on the above described resistor structure will become obvious to those skilled in the art in light of the above description. These variations are intended to fall within the scope of the present invention.

I claim:

1. A resistor for use in an integrated circuit in which resistive material is formed on an insulating layer which is above a semiconductor substrate, said resistive material being patterned into a resistor having a laterally extending top surface, a laterally extending bottom surface contacting said insulating layer, two opposing upwardly extending side surfaces, and between said side surfaces two upwardly extending end surfaces, said top surface being completely covered by insulating material, and in which conductive contacts to said resistor are made against said upwardly extending end surfaces.

2. A resistor as in claim 1 in which said side surfaces are covered by an insulating material.

3. A resistor as in claim 2 in which said conductive contacts are separated from said top and side surfaces of said resistor by said insulating material.

4. A resistor as in claim 1 in which said upwardly extending end surfaces are approximately vertical.

5. A resistor as in claim 1 in which said upwardly extending end surfaces are at an angle determined by crystalline structure of said resistive material.

* * * * *